US012684738B2

(12) United States Patent
Sy et al.

(10) Patent No.: US 12,684,738 B2
(45) Date of Patent: Jul. 14, 2026

(54) COMPUTING RACK LIQUID COOLING ADAPTER SYSTEM AND METHOD

(71) Applicant: Dell Products L.P., Round Rock, TX (US)

(72) Inventors: Ben John Sy, Austin, TX (US); James Don Curlee, Round Rock, TX (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 198 days.

(21) Appl. No.: 18/423,584

(22) Filed: Jan. 26, 2024

(65) Prior Publication Data

US 2025/0248005 A1     Jul. 31, 2025

(51) Int. Cl.
H05K 7/20 (2006.01)

(52) U.S. Cl.
CPC ................................ H05K 7/20781 (2013.01)

(58) Field of Classification Search
CPC ................................................. H05K 7/20272
See application file for complete search history.

(56) References Cited

U.S. PATENT DOCUMENTS

| | | | | |
|---|---|---|---|---|
| 11,191,185 B2 * | 11/2021 | Chopra | ............... | H05K 7/2079 |
| 2017/0127552 A1 * | 5/2017 | White | ................. | H05K 7/1492 |
| 2023/0085165 A1 * | 3/2023 | Gao | ..................... | H05K 7/1489 |
| | | | | 361/699 |

* cited by examiner

*Primary Examiner* — Mukundbhai G Patel
(74) *Attorney, Agent, or Firm* — Fogarty LLP

(57) ABSTRACT

Embodiments of the present disclosure provide a computing rack liquid cooling adapter system and method that enables compatibility among differing cooling system architectures of different types. According to one embodiment, a computing rack liquid cooling adapter system includes a tray configured to be inserted in a slot of a computing rack, and first and second pairs of liquid coolant connectors. The first pair of liquid coolant connectors are mounted on the tray and are compatible with a rack liquid cooling system of the computing rack. The second pair of liquid coolant connectors are compatible with a module liquid cooling system of a computing module and are different than the first pair of liquid coolant connectors. Additionally, corresponding ones of the second pair of liquid coolant connectors are in fluid communication with the first pair of liquid coolant connectors for providing cooling to the computing module.

18 Claims, 7 Drawing Sheets

200

140

150
152
154

300

COMPUTING RACK LIQUID COOLING ADAPTER SYSTEM AND METHOD

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as enterprise blade servers that are stacked and installed within computing racks, which may also be referred to as racks. A data center may include large numbers of such computing racks that are organized into rows of racks. Administration of such large groups of IHSs may require teams of remote and local administrators working in shifts in order to support around-the-clock availability of the data center operations while minimizing any downtime.

Racks provide a means for densely housing relatively large numbers of individual computing devices. A principal challenge with such dense packaging often involves providing sufficient cooling for each of the computing devices. As such, many newer computing rack designs have implemented liquid cooling systems, such as liquid immersion cooling, or liquid cooling provided by cold plates that are thermally coupled to the principal heat generating components of the computing device.

SUMMARY

Embodiments of the present disclosure provide a computing rack liquid cooling adapter system and method that enables compatibility among differing cooling system architectures of different types. According to one embodiment, a computing rack liquid cooling adapter system includes a tray configured to be inserted in a slot of a computing rack, and first and second pairs of liquid coolant connectors. The first pair of liquid coolant connectors are mounted on the tray and are compatible with a rack liquid cooling system of the computing rack. The second pair of liquid coolant connectors are compatible with a module liquid cooling system of a computing module and are different than the first pair of liquid coolant connectors. Additionally, corresponding ones of the second pair of liquid coolant connectors are in fluid communication with the first pair of liquid coolant connectors for providing cooling to the computing module.

According to another embodiment, an Information Handling System (IHS) includes at least one computing module, a tray configured to be inserted in a slot of a computing rack of the HIS, and a first pair of liquid coolant connectors mounted on the tray I which the first pair of liquid coolant connectors being compatible with a rack liquid cooling system of the computing rack. The IHS also includes a second pair of liquid coolant connectors that are compatible with a module liquid cooling system of a computing module in which corresponding ones of the second pair of liquid coolant connectors are in fluid communication with the first pair of liquid coolant connectors, wherein the second pair of liquid coolant connectors are different than the first pair of liquid coolant connectors.

BRIEF DESCRIPTION OF THE DRAWINGS

The present invention(s) is/are illustrated by way of example and is/are not limited by the accompanying figures. Elements in the figures are illustrated for simplicity and clarity and have not necessarily been drawn to scale.

DETAILED DESCRIPTION

Figure 1A:
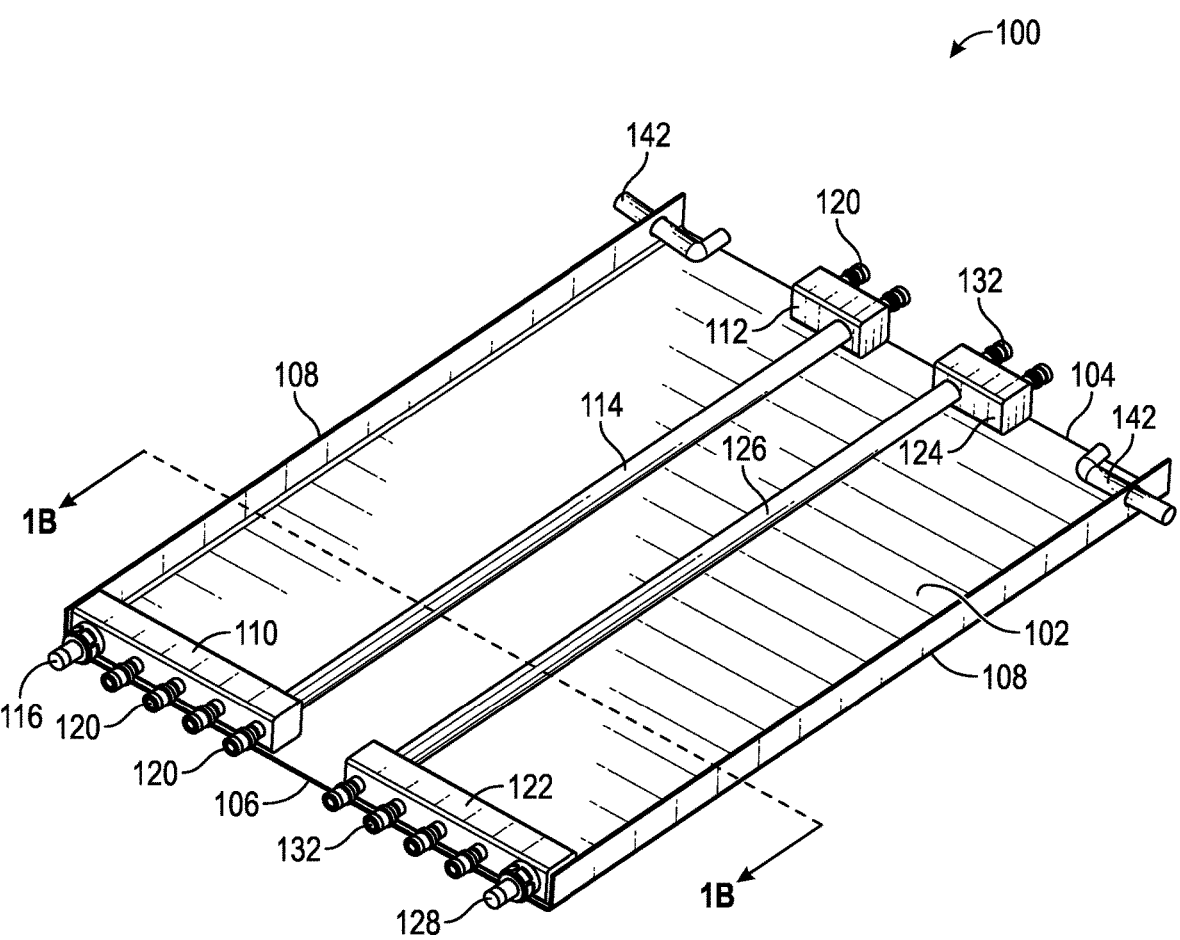
FIGS. 1A-1B illustrate an example computing rack liquid cooling adapter that may be implemented on an OCP 21 inch rack according to one embodiment of the present disclosure.

The present disclosure is described with reference to the attached figures. The figures are not drawn to scale, and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

As described previously, liquid cooling for computing racks has become an attractive alternative to air cooling due in large part to the relatively dense housing of their constituent components, which can each generate relatively large levels of heat. Liquid cooling is being adopted in many data centers due to significant reduction in operational expenditures compared to air cooled systems. Liquid cooling systems usually utilize a cold plate that replaces the CPU's heat sink in which the cold plate is cooled using flexible conduits that circulate a liquid, such as a water, or a blend of water and other water-based materials. With increasing demand for higher performance and density, next generation architectures will require direct liquid cooling (DLC). The Open Compute Project 21" standard (OCP21) will require blind mating for DC power as well as DLC couplers/manifolds, thus increasing the overall complexity and cost of both the OCP21 system chassis and OCP 21 inch rack.

Enterprise-based computing systems are typically deployed as modular systems with standardized form factor computing modules mounted in standardized support structures. The computing modules have been commonly mounted in standardized support structures such as the 19 inch racks as specified by the Electronic Industries Alliance (EIA-310-D) specification. More recently, a new standards organization called the Open Compute Project (OCP) has been formed to promote a new rack standard commonly referred to as Open Rack. OCP is a collaborative community effort focused on redesigning hardware to efficiently support the growing demands of a computer's infrastructure. Development of computing racks conforming to the OCP standard, nevertheless, has been slow to adopt. One reason is that computing modules designed for the OCP 21 inch racks have not been heretofore backward compatible with EIA-310-D 19 inch racks. Nevertheless, computing modules compatible with EIA-310-D 19 inch racks will continue to be developed in parallel with those that are compatible with the OCP 21 inch racks. There will be a need to adapt 19 inch liquid enabled computing modules to OCP 21 inch racks and vice-versa.

Several hurdles, however, exist with ensuring the compatibility of computing modules with both EIA and OCP racks. For one reason, OCP racks utilize large Blind Mate Quick Disconnect (BMQD) manifolds that require an external, continual clamping force to keep the socket and plug mated. This problem is compounded by the fact that internal spring-loaded valves and fluid pressure work to push these connectors apart. For another reason, EIA-310-D racks use locking, hand-mate liquid disconnects that are generally incompatible with their OCP counterparts. Typically, the EIA-310-D compliant sockets use locking, hand-mate liquid disconnects that are incompatible with the OCP compliant sockets that use internal spring-loaded valves and fluid pressure that work to push the connectors apart. As will be described in detail herein below, embodiments of the present disclosure provide a computing rack liquid cooling adapter system and method that locks to the rack manifold blind mate Quick Disconnect's (QD's) and present the appropriate hand mate, locking connectors for the EIA-310-D rack based computing module.

Figure 1B:
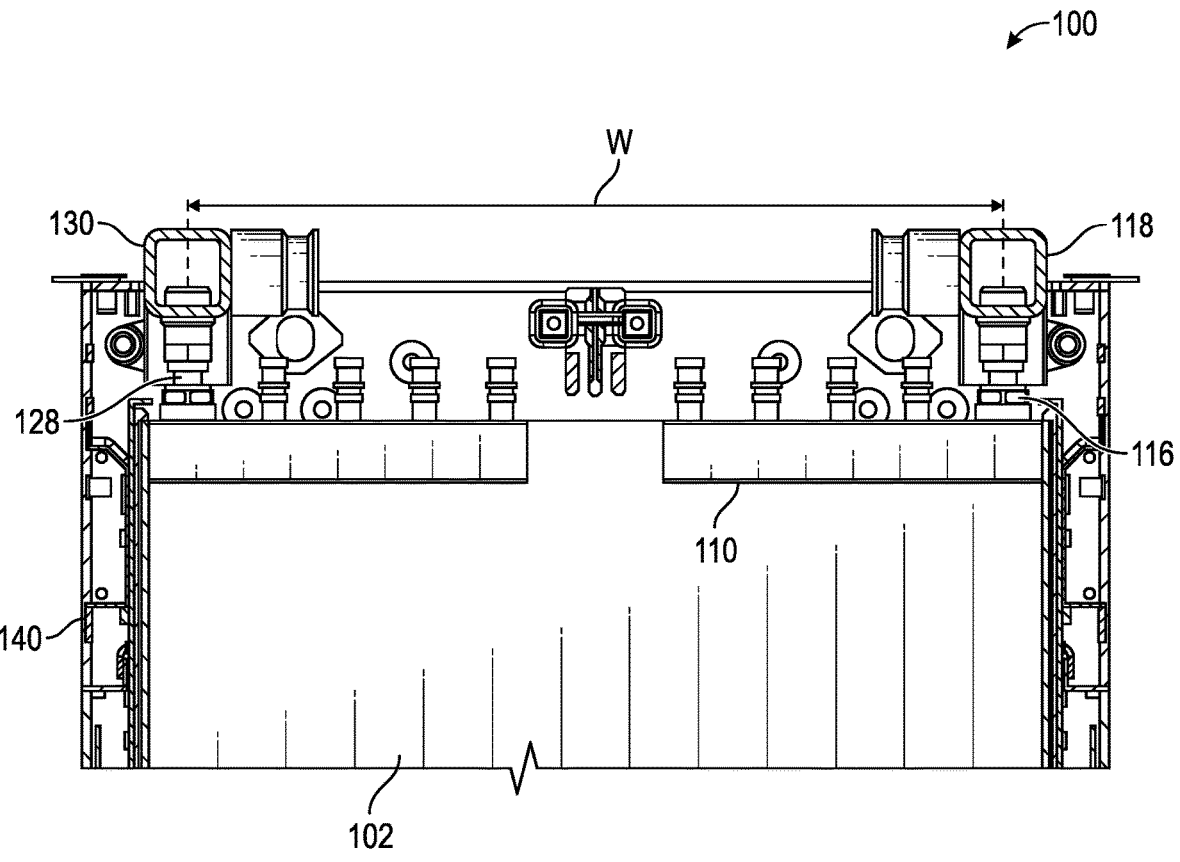

FIGS. 1A-1B illustrate an example computing rack liquid cooling adapter 100 that may be implemented on an OCP 21 inch rack according to one embodiment of the present disclosure. In particular, FIG. 1A is a perspective view of the liquid cooling adapter 100, while FIG. 1B is a partial, top view of the computing rack liquid cooling adapter taken along the lines 1B-1B of FIG. 1A. Additionally, FIG. 1B shows a partial, top view of an OCP 21 inch rack 140 on which the computing rack liquid cooling adapter 100 has been inserted, while the computing rack liquid cooling adapter 100 of FIG. 1A is shown being removed from the OCP 21 inch rack 140. While the present embodiment is described as being adapted for use with an OCP 21 inch rack, it should be appreciated that other embodiments may be adapted for use with any type of computing rack that uses liquid cooling.

The computing rack liquid cooling adapter 100 includes a tray 102 with a front edge 104, a rear edge 106, and two side edges 108. The computing rack liquid cooling adapter 100 also includes an inlet liquid coolant assembly that may be used to distribute chilled fluid to one or more EIA-310-D compliant plugs configured on an EIA-310-D compliant computing module. The inlet liquid coolant assembly includes a rear-facing manifold 110 mounted proximate the rear edge 106 of the tray 102, and a front-facing manifold 112 mounted proximate the front edge 104 of the tray 102 that in fluid communication with one another via an elongated section of conduit 114. The rear-facing manifold 110 includes an OCP 21 inch rack compliant plug 116 (e.g., connector) that is adapted for blind mating with an OCP 21 inch rack compliant socket 118 (e.g., complementary connector) configured on the OCP rack 140. The rear-facing manifold 110 and front-facing manifold 112 each include one or more EIA-310-D compliant sockets 120 (e.g., connector). In general, the OCP 21 inch rack compliant plug 114 receives chilled liquid from the OCP 21 inch rack compliant socket 118, and distributes the chilled liquid to the EIA-310-D compliant sockets 120 configured on the rear-facing manifold 110 and front-facing manifold 112.

The computing rack liquid cooling adapter 100 also includes an outlet liquid coolant assembly that may be used to receive fluid from one or more EIA-310-D compliant plugs configured on the EIA-310-D compliant computing module. The outlet liquid coolant assembly includes a rear-facing manifold 122 mounted proximate the rear edge 106 of the tray 102, and a front-facing manifold 124 mounted proximate the front edge 104 of the tray 102 that are in fluid communication with one another via an elongated section of conduit 126. The rear-facing manifold 122 includes an OCP 21 inch rack compliant plug 128 that is adapted for blind mating with an OCP 21 inch rack compliant socket 130 configured on the OCP rack 140. The rear-facing manifold 122 and front-facing manifold 124 each include one or more EIA-310-D compliant sockets 132 that may be used for fluid connection with one or more EIA-310-D compliant plugs configured on an EIA-310-D compliant computing module. In general, the EIA-310-D compliant sockets 132 receive fluid that has been used to cool the computing modules and returns it to the OCP 21 inch rack compliant socket 130.

The rear-facing manifolds 110 and 122 are mounted on the tray 102 so that the OCP 21 inch rack compliant plugs 116 and 128 have a specified width W to be blind mated with the OCP 21 inch rack compliant socket 118 and 130 when the computing rack liquid cooling adapter 100 is inserted into the rack 140. Because the OCP 21 inch rack compliant plugs 116 and 128 may require up to 35 pounds (Lbs.) of insertion force, insertion levers 142 may be provided to overcome a total insertion force of approximately 70 Lbs. (e.g., 35 Lbs.×2).

Figure 2A:
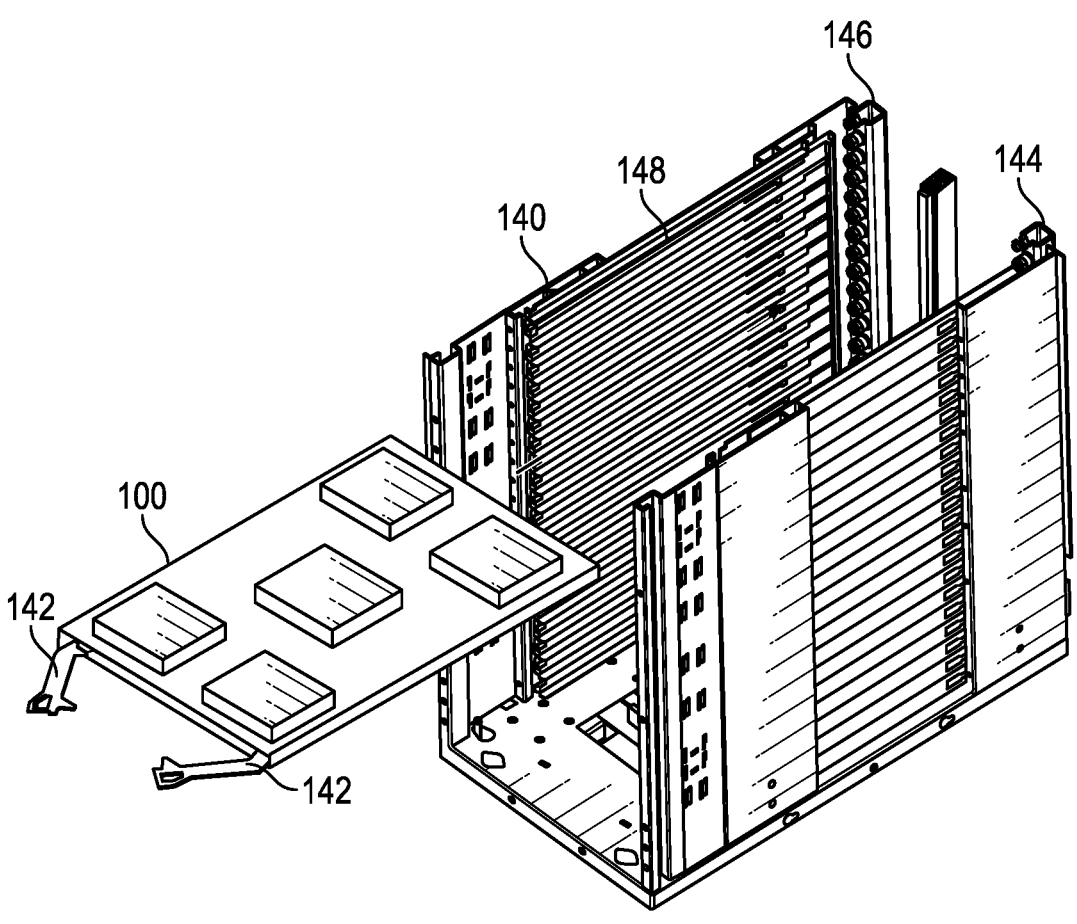
FIGS. 2A and 2B illustrate how the computing rack liquid cooling adapter may be used to adapt an Open Compute Project 21 (OCP21) inch rack compliant direct liquid cooling (DLC) system to an Electronic Industries Alliance (EIA-310-D) 19 inch rack computing modules according to one embodiment of the present disclosure.
Figure 2B:
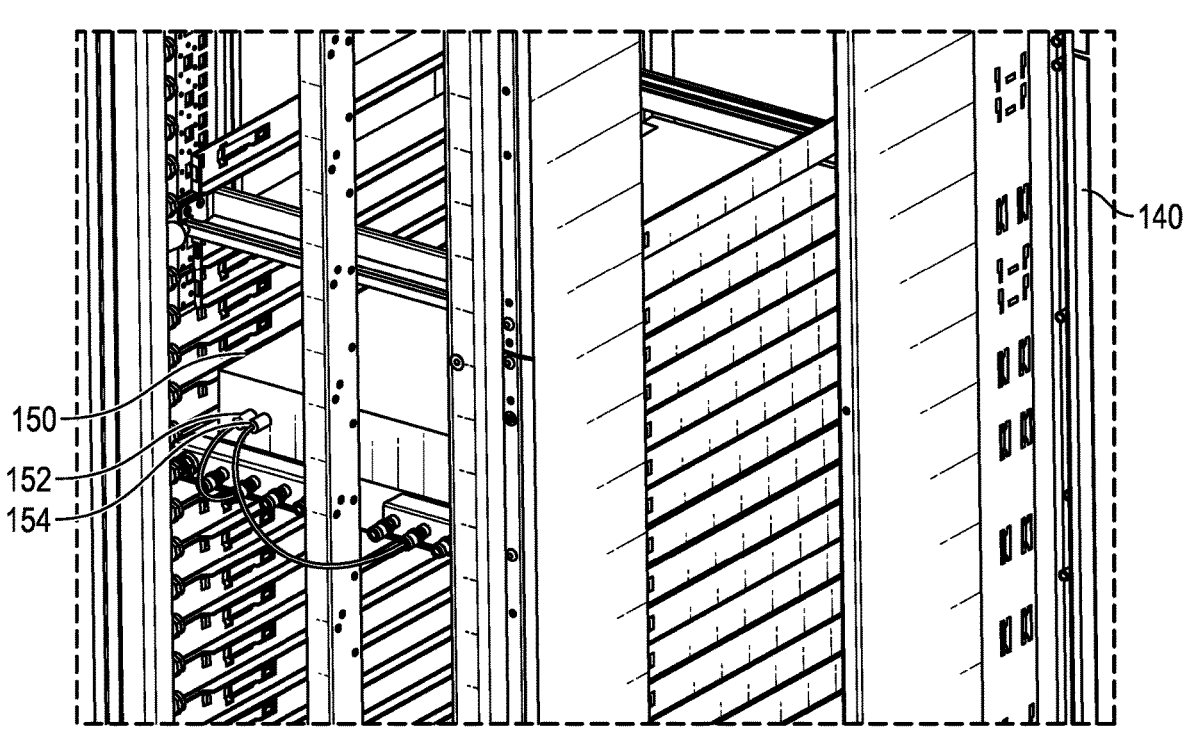

FIGS. 2A and 2B illustrate how the computing rack liquid cooling adapter 100 may be used to adapt an OCP 21 inch rack compliant direct liquid cooling (DLC) system to an EIA-310-D 19 inch rack computing modules according to one embodiment of the present disclosure. In particular, FIG. 2A shows a partial, perspective view of an OCP 21 inch rack 140 in which the computing rack liquid cooling adapter 100 is being inserted, while FIG. 2B shows a partial, perspective view of the OCP 21 inch rack 140 in which the computing rack liquid cooling adapter 100 is fully inserted. As best shown in FIG. 2A, the computing rack liquid cooling adapter 140 includes an OCP 21 inch rack compliant fluid input manifold 144 on which the OCP 21 inch rack compliant plug 116 is configured, and an OCP 21 inch rack compliant fluid output manifold 146 on which the OCP 21 inch rack compliant plug 128 is configured.

To use, the computing rack liquid cooling adapter 100 is inserted into one of the slots 148 of the OCP 21 inch rack 140 as shown in FIG. 2A. To complete insertion, the levers

142 may be used to overcome the insertion force of the OCP 21 inch rack compliant plugs 116 and 128. Once inserted, one or more computing modules 150 may be inserted into the OCP 21 inch rack 140 either above or below the OCP 21 inch rack 140. Although only one computing module 150 is shown, it should be appreciated that any quantity of computing modules 150 may be used with the computing rack liquid cooling adapter 100. The only limitation is the quantity of EIA-310-D compliant sockets 132 provided on the computing rack liquid cooling adapter 100. In some embodiments, the computing module 150 may be secured in the OCP 21 inch rack 140 in any suitable manner. For example, the computing module 150 may be secured either to the computing rack liquid cooling adapter 100 or directly to the OCP 21 inch rack 140 using screws or straps.

Once the computing module 150 is inserted, an EIA-310-D compliant input liquid conduit 152 is coupled between one EIA-310-D compliant socket 120 and the computing module 150, and an EIA-310-D compliant output liquid conduit 154 is coupled between one EIA-310-D compliant socket 132 and the computing module 150 as best shown in FIG. 2B. At this point, the OCP compliant DLC system configured on the OCP 21 inch rack 140 may be used to cool the EIA-310-D compliant computing module 150.

Figure 3A:
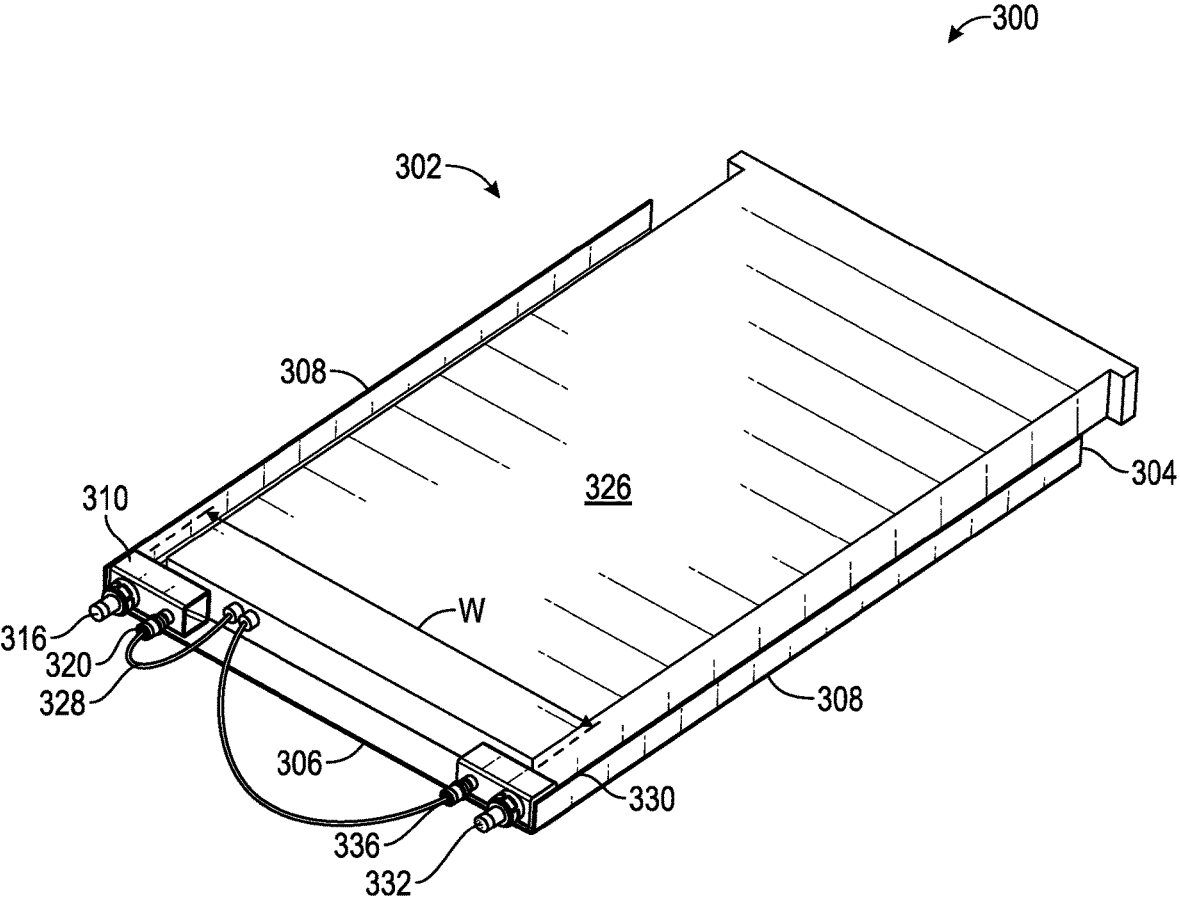
FIGS. 3A and 3B illustrate another example computing rack liquid cooling adapter that may be implemented on an OCP 21 inch rack according to one embodiment of the present disclosure.
Figure 3B:
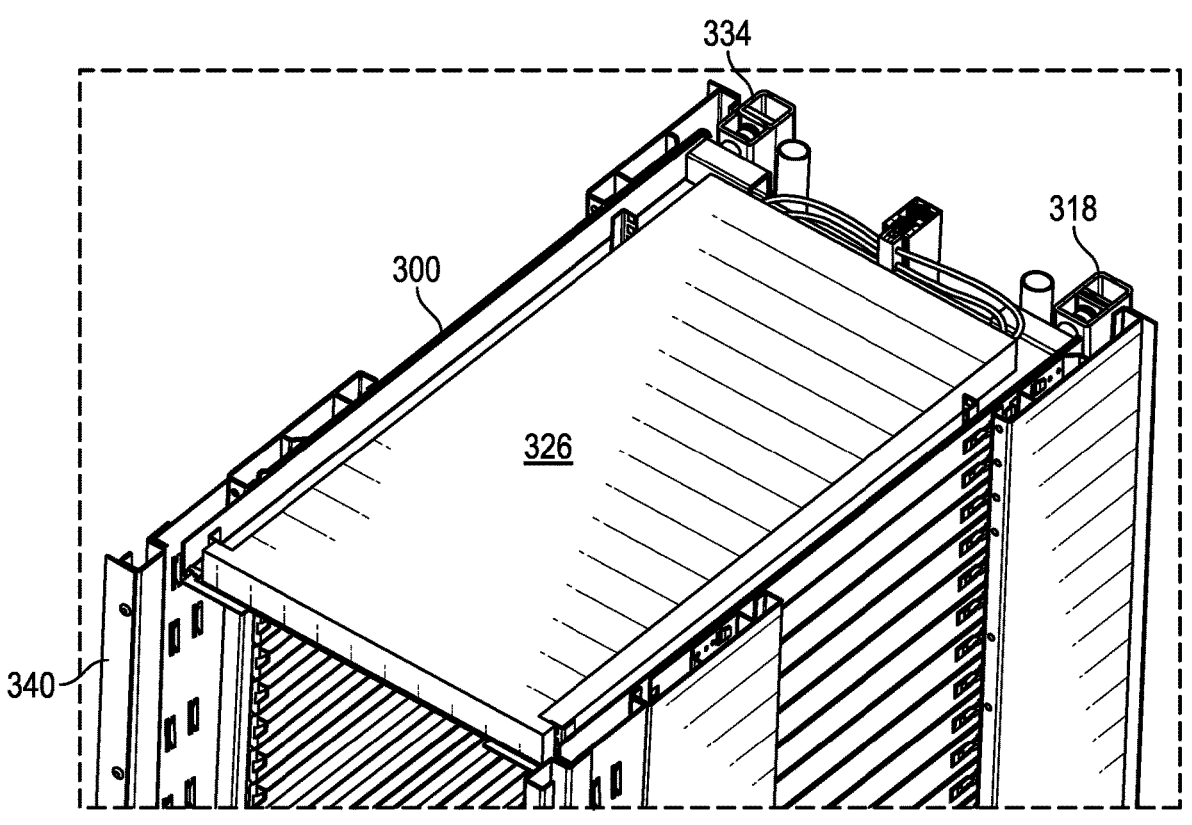

FIGS. 3A and 3B illustrate another example computing rack liquid cooling adapter 300 that may be implemented on an OCP 21 inch rack according to one embodiment of the present disclosure. In particular, FIG. 3A is a perspective view of the liquid cooling adapter 300 that has been removed from an OCP rack 340, while FIG. 3B is a partial, perspective view of an OCP rack 340 on which the computing rack liquid cooling adapter 300 is inserted. While the present embodiment is described as being adapted for use with an OCP 21 inch rack 340, it should be appreciated that other embodiments may be adapted for use with any type of computing rack that uses liquid cooling.

The computing rack liquid cooling adapter 300 includes a tray 302 having a front edge 304, a rear edge 306, and two side edges 308. The computing rack liquid cooling adapter 300 also includes an inlet liquid coolant assembly including a hollow block 310 mounted proximate the rear edge 306 of the tray 302. The hollow block 310 is fitted with an OCP 21 inch rack compliant plug 316 that is adapted for blind mating with an OCP 21 inch rack compliant socket 318 configured on the OCP rack 340. The hollow block 310 is also fitted with an EIA-310-D compliant socket 320. In general, the OCP 21 inch rack compliant plug 316 receives chilled liquid from the OCP 21 inch rack compliant socket 318, and distributes the chilled liquid to a computing module 326 via a conduit 328 coupled to the EIA-310-D compliant socket 320 configured on the hollow block 310.

The computing rack liquid cooling adapter 300 also includes an outlet liquid coolant assembly including a hollow block 330 mounted proximate the rear edge 306 of the tray 302. The hollow block 330 is fitted with an OCP 21 inch rack compliant plug 332 that is adapted for blind mating with an OCP 21 inch rack compliant socket 334 configured on the OCP rack 340. The hollow block 330 is also fitted with an EIA-310-D compliant socket 336 and is in fluid communication with the OCP 21 inch rack compliant plug 332. In general, the EIA-310-D compliant socket 336 receives fluid that has been used to cool the computing module 326 and returns it to the OCP 21 inch rack compliant socket 334.

The hollow blocks 310 are 330 are rigid in structure thus maintaining the OCP 21 inch rack compliant plugs 320 and 332 a specified width W apart from one another. The width W is selected to enable the OCP 21 inch rack compliant plugs 320 and 332 to be blind mated with the OCP 21 inch rack compliant sockets 318 and 334 when the computing rack liquid cooling adapter 300 is inserted into the rack 340. The computing module 326 may be mounted to the computing rack liquid cooling adapter 300 in any suitable manner. For example, the computing module 326 may be mounted to the computing rack liquid cooling adapter 300 using screws or other suitable attachment mechanism. Thus as shown and described the computing rack liquid cooling adapter 300 may be used to deploy an EIA-310-D compliant computing module 326 in a OCP 21 inch rack.

Figure 4:
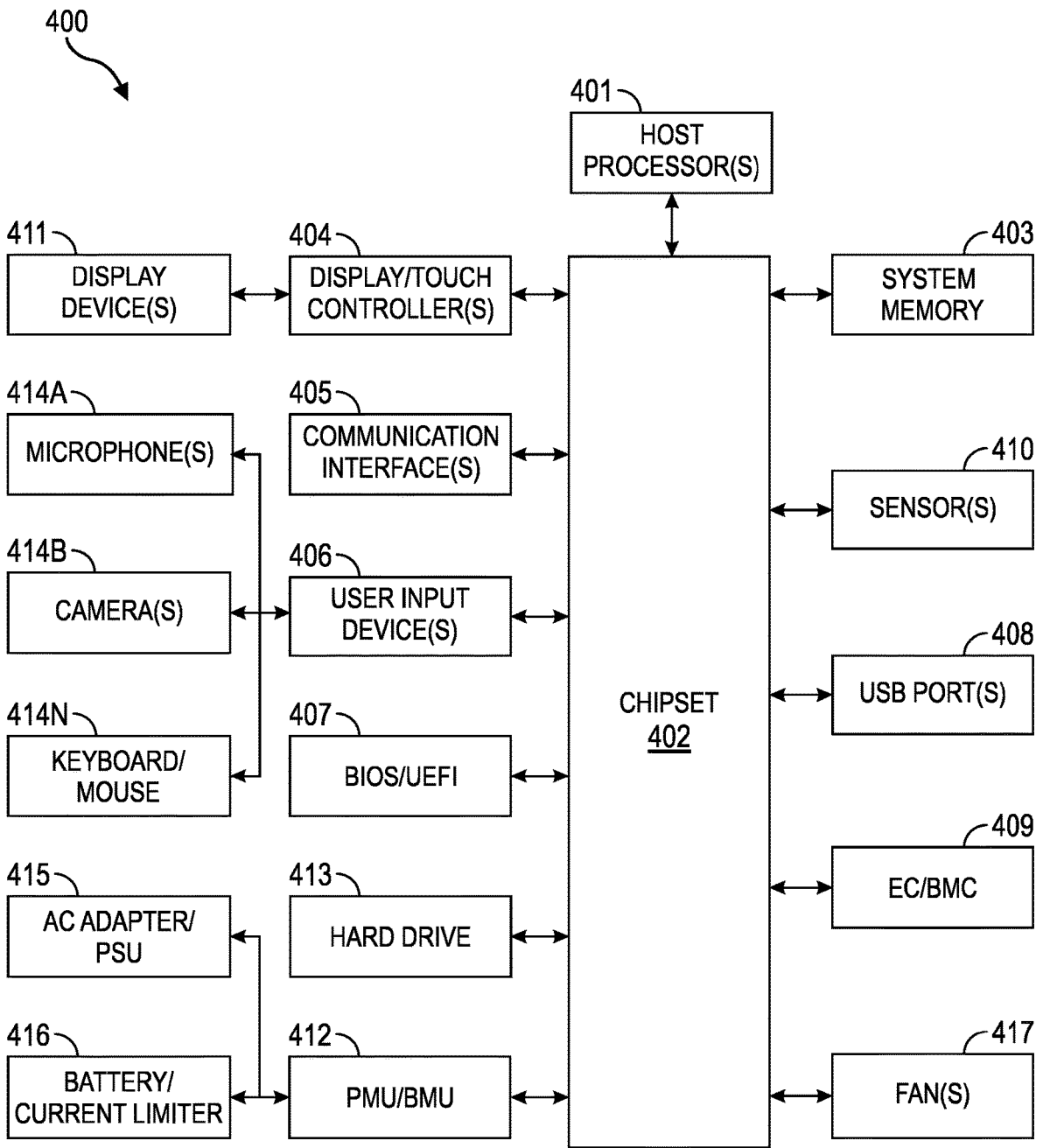
FIG. 4 is a block diagram of components of an example IHS, which may be embodied as one or more of the computing modules described herein above.

FIG. 4 is a block diagram of components of an example IHS 400, which may be embodied as one or more of the computing modules 150 and 326 described herein above. As depicted, IHS 400 includes host processor(s) 401. In various embodiments, IHS 400 may be a single-processor system, a multi-processor system including two or more processors, and/or a heterogeneous computing platform. Host processor(s) 401 may include any processor capable of executing program instructions, such as a PENTIUM processor, or any general-purpose or embedded processor implementing any of a variety of Instruction Set Architectures (ISAs), such as an x86 or a Reduced Instruction Set Computer (RISC) ISA (e.g., POWERPC, ARM, SPARC, MIPS, etc.).

IHS 400 includes chipset 402 coupled to host processor(s) 401. Chipset 402 may provide host processor(s) 401 with access to several resources. In some cases, chipset 402 may utilize a QuickPath Interconnect (QPI) bus to communicate with host processor(s) 401.

Chipset 402 may also be coupled to communication interface(s) 405 to enable communications between IHS 400 and various wired and/or wireless networks, such as Ethernet, WiFi, BLUETOOTH (BT), cellular or mobile networks (e.g., Code-Division Multiple Access or "CDMA," Time-Division Multiple Access or "TDMA," Long-Term Evolution or "LTE," etc.), satellite networks, or the like.

Communication interface(s) 405 may also be used to communicate with certain peripherals devices (e.g., BT speakers, microphones, headsets, etc.). Moreover, communication interface(s) 405 may be coupled to chipset 402 via a Peripheral Component Interconnect Express (PCIe) bus, or the like.

Chipset 402 may be coupled to display/touch controller(s) 404, which may include one or more Graphics Processor Units (GPUs) on a graphics bus, such as an Accelerated Graphics Port (AGP) or PCIe bus. As shown, display/touch controller(s) 404 provide video or display signals to one or more display device(s) 411.

Display device(s) 411 may include Liquid Crystal Display (LCD), Light Emitting Diode (LED), organic LED (OLED), or other thin film display technologies. Display device(s) 411 may include a plurality of pixels arranged in a matrix, configured to display visual information, such as text, two-dimensional images, video, three-dimensional images, etc. In some cases, display device(s) 411 may be provided as a single continuous display, or as two or more discrete displays.

Chipset 402 may provide host processor(s) 401 and/or display/touch controller(s) 404 with access to system memory 403. In various embodiments, system memory 403 may be implemented using any suitable memory technology, such as static RAM (SRAM), dynamic RAM (DRAM) or magnetic disks, or any nonvolatile/Flash-type memory, such as a solid-state drive (SSD) or the like.

Chipset 402 may also provide host processor(s) 401 with access to one or more Universal Serial Bus (USB) ports 408, to which one or more peripheral devices may be coupled (e.g., integrated or external webcams, microphones, speakers, etc.).

Chipset 402 may further provide host processor(s) 401 with access to one or more hard disk drives, solid-state drives, optical drives, or other removable-media drives 413.

Chipset 402 may also provide access to one or more user input devices 406, for example, using a super I/O controller or the like. Examples of user input devices 406 may include, but are not limited to, microphone(s) 414A, camera(s) 414B, and keyboard/mouse 414N. Other user input devices 406 may include a touchpad, trackpad, stylus or active pen, totem, etc.

Each user input devices 406 may include a respective controller (e.g., a touchpad may have its own touchpad controller) that interfaces with chipset 402 through a wired or wireless connection (e.g., via communication interfaces(s) 405). In some cases, chipset 402 may also provide access to one or more user output devices (e.g., video projectors, paper printers, 3D printers, loudspeakers, audio headsets, Virtual/Augmented Reality (VR/AR) devices, etc.). In certain embodiments, chipset 402 may further provide an interface for communications with hardware sensors 410.

Sensors 410 may be disposed on or within the chassis of IHS 400, or otherwise coupled to IHS 400, and may include, but are not limited to: electric, magnetic, radio, optical (e.g., camera, webcam, etc.), infrared, thermal (e.g., thermistors etc.), force, pressure, acoustic (e.g., microphone), ultrasonic, proximity, position, deformation, bending, direction, movement, velocity, rotation, gyroscope, Inertial Measurement Unit (IMU), and/or acceleration sensor(s).

The Unified Extensible Firmware Interface (UEFI) was designed as a successor to BIOS. As a result, many modern IHSs utilize UEFI in addition to or instead of a BIOS. As used herein, BIOS 407 is intended to also encompass a UEFI component.

Embedded Controller (EC) or Baseboard Management Controller (BMC) 409 is operational from the very start of each IHS power reset and handles various tasks not ordinarily handled by host processor(s) 401. Examples of these operations may include, but are not limited to: receiving and processing signals from a keyboard or touchpad, as well as other buttons and switches (e.g., power button, laptop lid switch, etc.), receiving and processing thermal measurements (e.g., performing fan control, CPU and GPU throttling, and emergency shutdown), controlling indicator LEDs (e.g., caps lock, scroll lock, number lock, battery, power, wireless LAN, sleep, etc.), managing PMU/BMU 412, alternating current (AC) adapter/Power Supply Unit (PSU) 415 and/or battery/current limiter 416, allowing remote diagnostics and remediation over network(s), etc. For example, EC/BMC 409 may implement operations for interfacing with power adapter/PSU 415 in managing power for IHS 400. Such operations may be performed to determine the power status of IHS 400, such as whether IHS 400 is operating from AC adapter/PSU 415 and/or battery 416.

Firmware instructions utilized by EC/BMC 409 may also be used to provide various core operations of IHS 400, such as power management and management of certain modes of IHS 400 (e.g., turbo modes, maximum operating clock frequencies of certain components, etc.). In addition, EC/BMC 409 may implement operations for detecting certain changes to the physical configuration or posture of IHS 400. For instance, when IHS 400 is embodied as a 2-in-1 laptop/tablet form factor, EC/BMC 409 may receive inputs from a lid position or hinge angle sensor 410, and it may use those inputs to determine: whether the two sides of IHS 400 have been latched together to a closed position or a tablet position, the magnitude of a hinge or lid angle, etc. In response to these changes, the EC may enable or disable certain features of IHS 400 (e.g., front or rear facing camera, etc.).

In some cases, EC/BMC 409 may be configured to identify any number of IHS postures, including, but not limited to: laptop, stand, tablet, tent, or book. For example, when display(s) 411 of IHS 400 is open with respect to a horizontal keyboard portion, and the keyboard is facing up, EC/BMC 409 may determine IHS 400 to be in a laptop posture. When display(s) 411 of IHS 400 is open with respect to the horizontal keyboard portion, but the keyboard is facing down (e.g., its keys are against the top surface of a table), EC/BMC 409 may determine IHS 400 to be in a stand posture.

When the back of display(s) 411 is closed against the back of the keyboard portion, EC/BMC 409 may determine IHS 400 to be in a tablet posture. When IHS 400 has two display(s) 411 open side-by-side, EC/BMC 409 may determine IHS 400 to be in a book posture. When IHS 400 has two displays open to form a triangular structure sitting on a horizontal surface, such that a hinge between the displays is at the top vertex of the triangle, EC/BMC 409 may determine IHS 400 to be in a tent posture. In some implementations, EC/BMC 409 may also determine if display(s) 411 of IHS 400 are in a landscape or portrait orientation. In some cases, EC/BMC 409 may be installed as a Trusted Execution Environment (TEE) component to the motherboard of IHS 400.

Additionally, or alternatively, EC/BMC 409 may be configured to calculate hashes or signatures that uniquely identify individual components of IHS 400. In such scenarios, EC/BMC 409 may calculate a hash value based on the configuration of a hardware and/or software component coupled to IHS 400. For instance, EC/BMC 409 may calculate a hash value based on all firmware and other code or settings stored in an onboard memory of a hardware component.

Hash values may be calculated as part of a trusted process of manufacturing IHS 400 and may be maintained in secure storage as a reference signature. EC/BMC 409 may later recalculate the hash value for a component, compare it against the reference hash value to determine if any modifications have been made to the component, thus indicating that the component has been compromised. In this manner, EC/BMC 409 may validate the integrity of hardware and software components installed in IHS 400.

In various embodiments, IHS 400 may be coupled to an external power source (e.g., AC outlet or mains) through an AC adapter/PSU 415. AC adapter/PSU 415 may include an adapter portion having a central unit (e.g., a power brick, wall charger, or the like) configured to draw power from an AC outlet via a first electrical cord, convert the AC power to direct current (DC) power, and provide DC power to IHS 400 via a second electrical cord.

Additionally, or alternatively, AC adapter/PSU 415 may include an internal or external power supply portion (e.g., a switching power supply, etc.) connected to the second electrical cord and configured to convert AC to DC. AC adapter/PSU 415 may also supply a standby voltage, so that most of IHS 400 can be powered off after preparing for hibernation or shutdown, and powered back on by an event (e.g., remotely via wake-on-LAN, etc.). In general, AC adapter/PSU 415 may have any specific power rating, measured in volts or watts, and any suitable connectors.

IHS 400 may also include internal or external battery 416. Battery 416 may include, for example, a Lithium-ion or Li-ion rechargeable device capable of storing energy sufficient to power IHS 400 for an amount of time, depending upon the IHS's workloads, environmental conditions, etc. In some cases, a battery pack may also contain temperature sensors, voltage regulator circuits, voltage taps, and/or charge-state monitors. For example, battery 416 may include a current limiter, or the like.

In some embodiments, battery 416 may be configured to detect overcurrent or undervoltage conditions using Limits Management Hardware (LMH). As used herein, the term "overcurrent" refers to a condition in an electrical circuit that arises when a normal load current is exceeded (e.g., overloads, short circuits, etc.). Conversely, the term "undervoltage" refers to a condition (e.g., "brownout") where the applied voltage drops to X % of rated voltage (e.g., 90%), or less, for a predetermined amount of time (e.g., 1 minute).

Power Management Unit (PMU) 412 governs power functions of IHS 400, including AC adapter/PSU 415 and battery 416. For example, PMU 412 may be configured to: monitor power connections and battery charges, charging batteries, control power to other components, devices, or ICs, shut down components when they are left idle, control sleep and power functions (On and Off), managing interfaces for built-in keypad and touchpads, regulate real-time clocks (RTCs), etc.

In some implementations, PMU 412 may include one or more Power Management Integrated Circuits (PMICs) configured to control the flow and direction or electrical power in IHS 400. Particularly, a PMIC may be configured to perform battery management, power source selection, voltage regulation, voltage supervision, undervoltage protection, power sequencing, and/or charging operations. It may also include a DC-to-DC converter to allow dynamic voltage scaling, or the like.

Additionally, or alternatively, PMU 412 may include a Battery Management Unit (BMU) (referred to collectively as "PMU/BMU 412"). AC adapter/PSU 415 may be removably coupled to a battery charge controller within PMU/BMU 412 to provide IHS 400 with a source of DC power from battery cells within battery 416 (e.g., a lithium ion (Li-ion) or nickel metal hydride (NiMH) battery pack including one or more rechargeable batteries). PMU/BMU 412 may include non-volatile memory and it may be configured to collect and store battery status, charging, and discharging information, and to provide that information to other IHS components.

Examples of information collected and stored in a memory within PMU/BMU 412 may include, but are not limited to: operating conditions (e.g., battery operating conditions including battery state information such as battery current amplitude and/or current direction, battery voltage, battery charge cycles, battery state of charge, battery state of health, battery temperature, battery usage data such as charging and discharging data; and/or IHS operating conditions such as processor operating speed data, system power management and cooling system settings, state of "system present" pin signal), environmental or contextual information (e.g., such as ambient temperature, relative humidity, system geolocation measured by GPS or triangulation, time and date, etc.), and BMU events.

Examples of BMU events may include, but are not limited to acceleration or shock events, system transportation events, exposure to elevated temperature for extended time periods, high discharge current rate, combinations of battery voltage, battery current and/or battery temperature (e.g., elevated temperature event at full charge and/or high voltage causes more battery degradation than lower voltage), etc.

In some embodiments, power draw measurements may be conducted with control and monitoring of power supply via PMU/BMU 412. Power draw data may also be monitored with respect to individual components or devices of IHS 400. Whenever applicable, PMU/BMU 412 may administer the execution of a power policy, or the like.

IHS 400 may also include one or more fans 417 configured to cool down one or more components or devices of IHS 400 disposed inside a chassis, case, or housing. Fan(s) 417 may include any fan inside, or attached to, IHS 400 and used for active cooling. Fan(s) 417 may be used to draw cooler air into the case from the outside, expel warm air from inside, and/or move air across a heat sink to cool a particular IHS component. In various embodiments, both axial and sometimes centrifugal (blower/squirrel-cage) fans may be used.

In other embodiments, IHS 400 may not include all the components shown in FIG. 4. In other embodiments, IHS 400 may include other components in addition to those that are shown in FIG. 4. Furthermore, some components that are represented as separate components in FIG. 4 may instead be integrated with other components, such that all or a portion of the operations executed by the illustrated components may instead be executed by the integrated component.

For example, in various embodiments described herein, host processor(s) 401 and/or other components of IHS 400 (e.g., chipset 402, display/touch controller(s) 404, communication interface(s) 405, EC/BMC 409, etc.) may be replaced by discrete devices within a heterogeneous computing platform. As such, IHS 400 may assume different form factors including, but not limited to: servers, workstations, desktops, laptops, appliances, video game consoles, tablets, smartphones, etc.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A computing rack liquid cooling adapter system comprising:

a tray configured to be inserted in a slot of a computing rack;

a first pair of liquid coolant connectors mounted on the tray, the first pair of liquid coolant connectors being compatible with a rack liquid cooling system of the computing rack;

a second pair of liquid coolant connectors that are compatible with a module liquid cooling system of a computing module, wherein corresponding ones of the second pair of liquid coolant connectors are in fluid communication with the first pair of liquid coolant connectors, wherein the second pair of liquid coolant connectors are different than the first pair of liquid coolant connectors; and a pair of manifolds each fitted with a plurality of the second pairs of liquid coolant connectors.

2. The computing rack liquid cooling adapter system of claim 1, wherein the computing rack comprises an Open Compute Project 21 (OCP 21) inch computing rack, and the computing module comprises an Electronics Industries Alliance (EIA-310-D) computing rack compliant module.

3. The computing rack liquid cooling adapter system of claim 1, wherein the second pair of liquid coolant connectors are not compatible with the liquid coolant connectors of the computing rack.

4. The computing rack liquid cooling adapter system of claim 1, wherein the tray rigidly maintains the first pair of liquid coolant connectors at a specified distance apart.

5. The computing rack liquid cooling adapter system of claim 1, wherein the pair of manifolds are mounted on a rear edge of the tray.

6. The computing rack liquid cooling adapter system of claim 1, wherein the pair of manifolds are mounted on a front edge of the tray.

7. The computing rack liquid cooling adapter system of claim 1, further comprising a first and second pair of manifolds each fitted with a plurality of the second pairs of liquid coolant connectors, the first pair of manifolds mounted on a front edge of the tray, the second pair of manifolds mounted on a rear edge of the tray, the first and second pair of manifolds in fluid communication via a conduit extending between the first and second pair of manifolds.

8. The computing rack liquid cooling adapter system of claim 1, wherein the computing module is configured to be mounted on a surface of the tray.

9. An Information Handling System (IHS) comprising:

at least one computing module;

a tray configured to be inserted in a slot of a computing rack of the IHS;

a first pair of liquid coolant connectors mounted on the tray, the first pair of liquid coolant connectors being compatible with a rack liquid cooling system of the computing rack;

a second pair of liquid coolant connectors that are compatible with a module liquid cooling system of a computing module, wherein corresponding ones of the second pair of liquid coolant connectors are in fluid communication with the first pair of liquid coolant connectors, wherein the second pair of liquid coolant connectors are different than the first pair of liquid coolant connectors; and a pair of manifolds each fitted with a plurality of the second pairs of liquid coolant connectors.

10. The IHS of claim 9, wherein the computing rack comprises an Open Compute Project 21 (OCP 21) inch computing rack, and the computing module comprises an Electronics Industries Alliance (EIA-310-D) computing rack compliant module.

11. The IHS of claim 9, wherein the second pair of liquid coolant connectors are not compatible with the liquid coolant connectors of the computing rack.

12. The IHS of claim 9, wherein the tray rigidly maintains the first pair of liquid coolant connectors at a specified distance apart.

13. The IHS of claim 9, wherein the pair of manifolds are mounted on a rear edge of the tray.

14. The IHS of claim 9, wherein the pair of manifolds are mounted on a front edge of the tray.

15. The IHS of claim 9, further comprising a first and second pair of manifolds each fitted with a plurality of the second pairs of liquid coolant connectors, the first pair of manifolds mounted on a front edge of the tray, the second pair of manifolds mounted on a rear edge of the tray, the first and second pair of manifolds in fluid communication via a conduit extending between the first and second pair of manifolds.

16. The IHS of claim 9, wherein the computing module is configured to be mounted on a surface of the tray.

17. The computing rack liquid cooling adapter system of claim 4, wherein the first pair of liquid coolant connectors are configured to be blind mated when the tray is inserted in the computing rack.

18. The IHS of claim 12, wherein the first pair of liquid coolant connectors are configured to be blind mated when the tray in inserted in the computing rack.

* * * * *